United States Patent

Modi et al.

(10) Patent No.: US 7,633,142 B2
(45) Date of Patent: Dec. 15, 2009

(54) FLEXIBLE CORE FOR ENHANCEMENT OF PACKAGE INTERCONNECT RELIABILITY

(75) Inventors: Mitul B. Modi, Phoenix, AZ (US); Patricia A. Brusso, Chandler, AZ (US); Ruben Cadena, Tempe, AZ (US); Carolyn R. McCormick, Chandler, AZ (US); Sankara J. Subramanian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/977,980

(22) Filed: Oct. 26, 2007

(65) Prior Publication Data

US 2008/0054446 A1    Mar. 6, 2008

Related U.S. Application Data

(63) Continuation of application No. 11/134,784, filed on May 20, 2005, now Pat. No. 7,352,061.

(51) Int. Cl.
*H01L 23/12* (2006.01)
*H05K 7/00* (2006.01)

(52) U.S. Cl. .............. 257/668; 257/E23.174; 257/E23.007; 257/E23.077; 257/E23.194; 257/E23.008; 257/E23.069; 257/E23.173; 257/701; 257/758; 257/759; 257/703; 257/778; 257/700; 361/760; 361/748

(58) Field of Classification Search .......... 257/668, 257/700, 701, 703, 758, 774, 759, 778, E23.074, 257/E23.007, E23.077, E23.194, E23.008, 257/E23.069, E23.173; 361/760, 748
See application file for complete search history.

(56) References Cited

U.S. PATENT DOCUMENTS

| | | | |
|---|---|---|---|
| 6,274,821 B1 | 8/2001 | Echigo et al. | |
| 6,528,145 B1 | 3/2003 | Berger et al. | |
| 6,580,674 B1 * | 6/2003 | Nishiyama et al. | 369/112.01 |
| 6,818,972 B2 | 11/2004 | Jimarez et al. | |
| 6,849,934 B2 | 2/2005 | Ogawa et al. | |
| 7,119,003 B2 | 10/2006 | Bernier et al. | |
| 7,352,061 B2 | 4/2008 | Modi et al. | |
| 2002/0072145 A1 | 6/2002 | Tanaka et al. | |
| 2002/0180027 A1 | 12/2002 | Yamaguchi et al. | |
| 2005/0224948 A1 | 10/2005 | Lee et al. | |
| 2005/0288454 A1 * | 12/2005 | Matayabas et al. | 525/523 |
| 2006/0057421 A1 | 3/2006 | Maria et al. | |
| 2006/0231290 A1 | 10/2006 | Kariya et al. | |

FOREIGN PATENT DOCUMENTS

| | | |
|---|---|---|
| JP | 2002-319764 | 10/2002 |
| JP | 2003-69229 | 3/2003 |
| JP | 2004-214271 | 7/2004 |
| JP | 2004-281695 | 10/2004 |

* cited by examiner

*Primary Examiner*—Alexander O Williams
(74) *Attorney, Agent, or Firm*—Blakely, Sokoloff, Taylor & Zafman LLP

(57) ABSTRACT

An IC package is disclosed that comprises a core region disposed between upper and lower build-up layer regions. In one embodiment, the core region comprises a low modulus material. In an alternative embodiment the core region comprises a medium modulus material. In an alternative embodiment, the core material is selected based upon considerations such as it modulus, its coefficient of thermal expansion, and/or the resulting total accumulated strain. In an alternative embodiment, boundaries with respect to the softness of the core material are established be considering the reflective density in opposing conductive build-up layers above and below the core region.

6 Claims, 3 Drawing Sheets

FLEXIBLE CORE FOR ENHANCEMENT OF PACKAGE INTERCONNECT RELIABILITY

RELATED APPLICATIONS

The present continuation application is related to, incorporates by reference and hereby claims the priority benefit of the following U.S. patent application, assigned to the assignee of the present application: U.S. patent application Ser. No. 11/134,784, filed May 20, 2005 now U.S. Pat No. 7,352,061.

FIELD OF THE INVENTION

Embodiments of the present invention relate generally to semiconductor technology and more specifically to semiconductor packaging.

BACKGROUND OF THE INVENTION

An integrated circuit (IC) package provides a number of functions for an IC that can be critical to its operation. These include (1) delivering power to the IC, (2) transferring information into and out of the IC, (3) dissipating heat, and (4) protecting the IC from physical and/or environmental damage. To the extent that the package is damaged or defective, one or more of these functions can be impacted. Depending on the degree of impact, the yield, functionality, and/or reliability of the IC can be affected.

Shown in FIG. 1 is a cross sectional view of ball grid array (BGA) package 100 that includes a BGA substrate 102 and an IC 104. The IC 104 is electrically connected to the BGA substrate 102 by way of controlled collapse chip connection (C4) solder interconnects 106. Underfill material 107 occupies regions between the BGA substrate 102 and the IC 104 and forms fillets 108 along the sidewalls of the IC 104. The C4 solder interconnects 106, underfill material 107, and fillets 108, in combination, rigidly attach the IC 104 to the BGA substrate 102.

The BGA substrate 102 electrically connects the C4 interconnects 106 to the BGA interconnects 110 by way of conductive traces, vias, and plated-thru-holes (not shown) in the BGA substrate. The BGA interconnects 110 connect to external circuitry 112, for example a motherboard. Here, the BGA substrate comprises three regions—a middle core region 102B and upper and lower build-up layer regions 102A and 102C, respectively.

Turning to FIG. 2, a more detailed cross-sectional view 200 of portions of BGA substrate 102 that includes build-up layer regions and core regions is shown. The build-up layer regions 102A and 102C each comprise a plurality of polymer build-up layers 204 and conductive build-up layers 202. The conductive build-up layers (typically copper) form conductive paths within the build-up layer regions that are interconnected by way of vias (not shown) disposed in intervening polymer build-up layers 204. The core 102B is a reinforced core that comprises glass fibers 208A/208B embedded in a polymer resin material 206, such as bismaleimide triazine (BT) epoxy. Plated-thru-holes thru the core region (not shown) connect conductive leads in the build-up layer region 102A with conductive leads in the build-up layer region 102C. The composite substrate 102 forms a relatively rigid and inflexible structure.

To the extent that the packaged IC experiences changes in temperature, for example during assembly or operation, the IC 104 and the package substrate 102 will expand and contract. The IC and substrate expansion and contraction typically occurs by different amounts because the IC and substrate comprise different materials that have different coefficients of thermal expansion (CTE). Because the IC 104 is rigidly attached to the package substrate 102, and the CTEs of the two do not match (e.g. the IC typically has a CTE of approximately 2-3 and the package substrate typically has a CTE of approximately 17-20), the expansion/contraction of the IC 104 and substrate 102 can cause bending of the package 100. This can impart strains on the BGA interconnects 110 which can over time produce BGA interconnect fatigue and failure.

Figure 1:
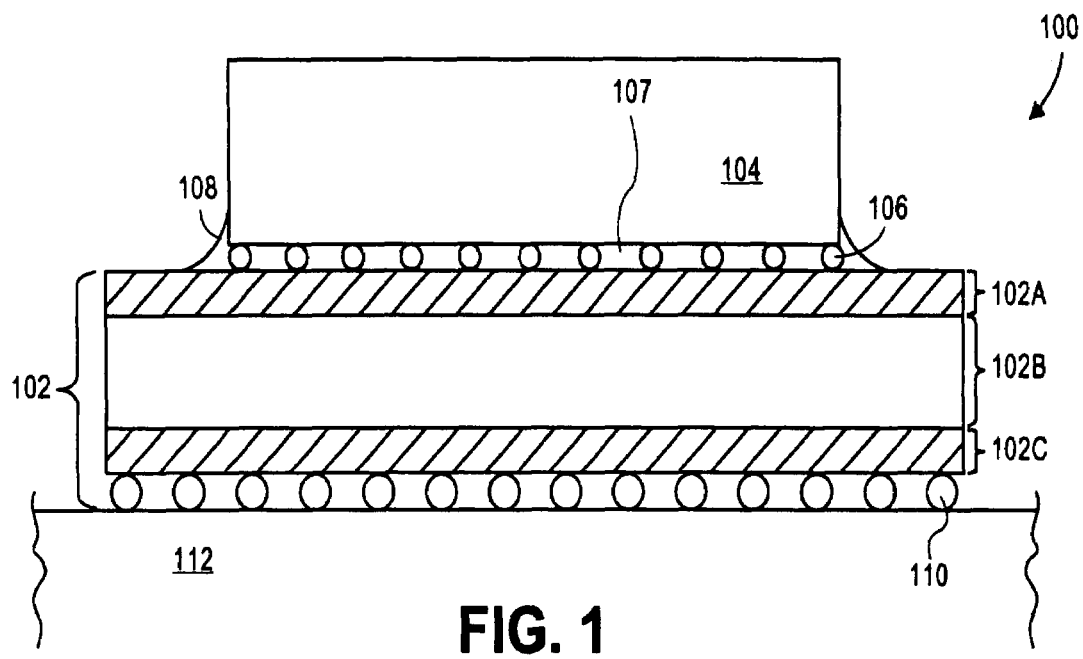
FIG. 1 illustrates a cross-sectional view of a portion of a semiconductor device package that includes an integrated circuit and a package substrate.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, an IC packaging substrate is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

To the extent that IC expansion and contraction imparts longitudinal, transverse, and/or shear strains onto a packaging substrate, BGA interconnects can fatigue and eventually fail. Embodiments of the present invention disclose a relatively flexible core or alternatively a relatively soft core in place of the stiff fiber reinforced core currently used in conventional packaging substrates. In one embodiment core flexibility and/or softness is increased by reducing core fiber density. In alternative embodiments, core flexibility and/or softness can increase by using core materials that include no fiber reinforcement and/or using alternative core materials. The softer and/or more flexible core accommodates strain and thereby (1) reduces the effects of accumulated strain induced as a result of IC/substrate CTE mismatch and (2) improves BGA interconnect reliability. Aspects of these and other embodiments will be discussed herein with respect to FIGS. 3-5, below. The figures, however, should not be taken to be limiting, as they are intended for the purpose of explanation and understanding.

Figure 2:
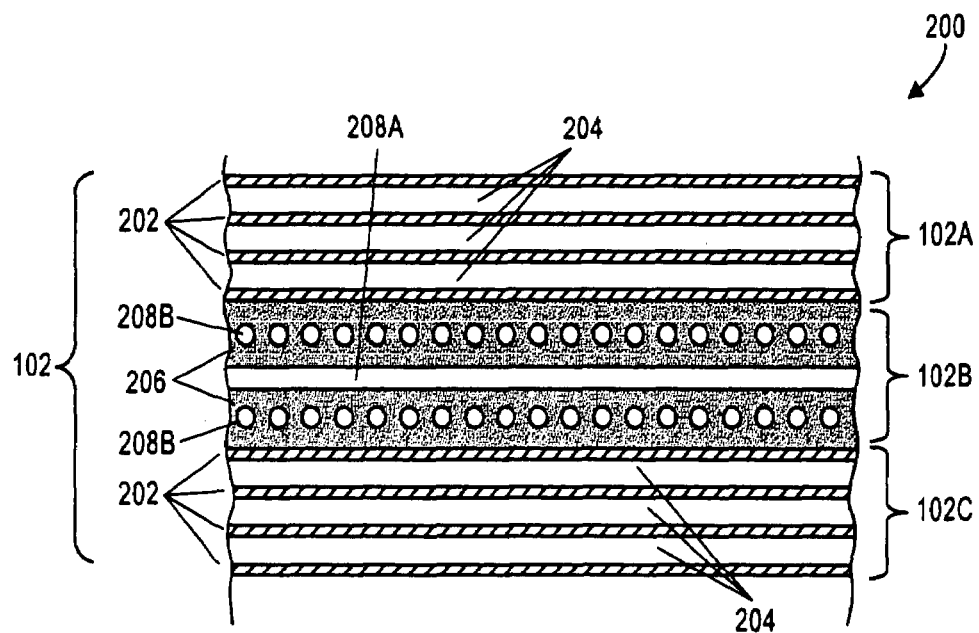
FIG. 2 illustrates a detailed cross-sectional view of portions of the semiconductor device package substrate shown in FIG. 1.
Figure 3:
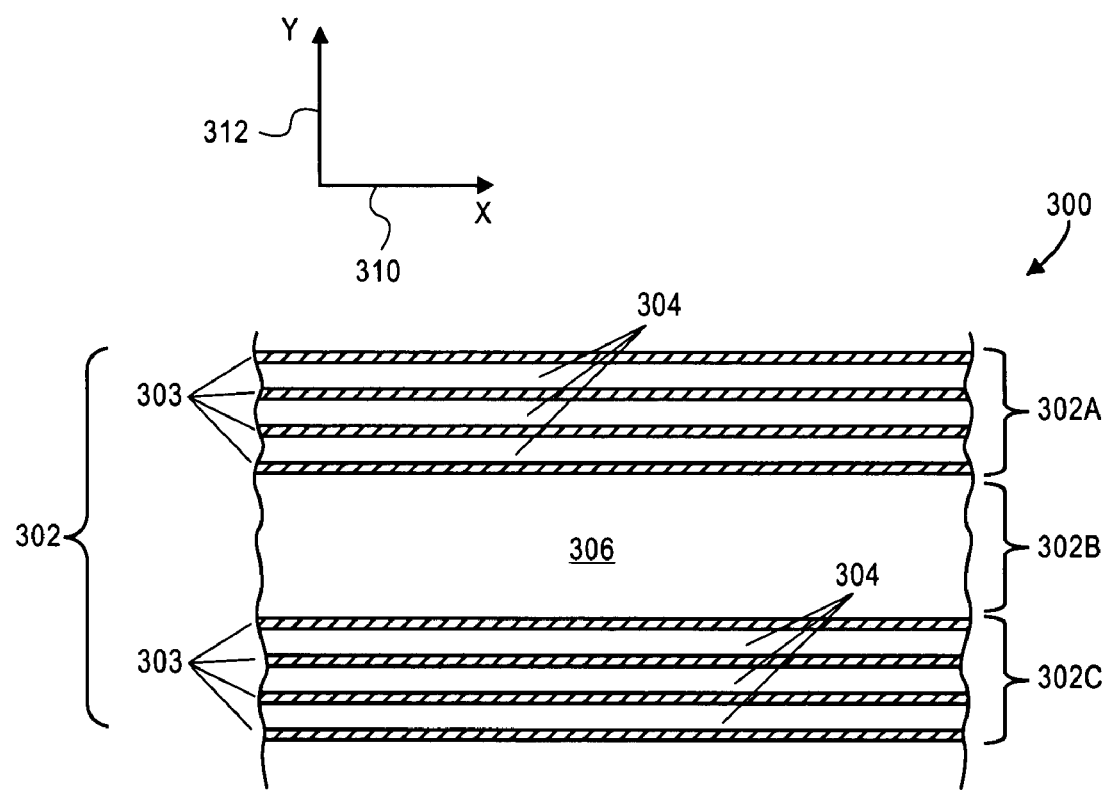
FIG. 3 illustrates a detailed cross-sectional view of portions of a semiconductor device package fabricated in accordance with an embodiment of the present invention.

Shown in FIG. 3 is a cross-sectional view 300 of portions of a package substrate 302 that includes a core region 302B disposed between build-up layer regions 302A and 302C. The build-up layer regions 302A and 302C are similar to build-up layer regions 102A and 102C discussed with respect to FIG. 2. However, unlike conventional packaging substrates, which use stiffer prior art fibrous resin cores, embodiments of the present invention incorporate a softer and/or more flexible core that allows the volumetric strains accompanying expansion and contraction of the IC to be absorbed. Under certain circumstances, this can decrease the amount of through-thickness plastic strain imparted by the IC onto critical BGA interconnects. For the purpose of this specification, soft core materials are generally considered to be materials having a modulus of elasticity (stiffness) as measured in Giga Pascals (GPa) of less than 5 GPa. Medium-stiff core materials are generally considered to be core materials having a stiffness in a range of approximately 5-15 GPa, and hard core materials are considered to be core materials having stiffness greater than approximately 15 GPa.

One of ordinary skill appreciates, however, that these ranges (i.e., soft, medium-stiff, and stiff) are relative and that while conventional core materials typically have an effective stiffness of approximately 20-25 GPa, this value can be reduced down to as low as 15 GPa or less when plated thru holes are present. So, in cores that have plated through holes, the values for medium-stiff, and stiff can change to reflect their presence. That is, for cores that include plated through holes, medium-stiff core materials could have a stiffness in a range of approximately 5-10 GPa and hard core materials could have a stiffness greater than approximately 10 GPa.

However, as will become evident, simply reducing the core material stiffness may not consistently reduce the strain imparted onto the BGA interconnects and consequently, it may not always reduce strain-related failures. The following discussion regarding the accumulation of strain in BGA interconnects for different substrate core compositions makes this clearer.

Table 1, below, summarizes the accumulation of strain in a critical BGA interconnect after one temperature cycle (i.e. a cycle from plus 85 degrees Celsius to minus 40 degrees Celsius) for different substrate core compositions. The degree/amount of strain may be indicative of fatigue and/or failure damage that can occur in BGA interconnects.

TABLE 1

| Column 1 Case (Core Composition) | Column 2 Core Stiffness (Modulus of Elasticity) | Column 3 CTE X Direction (ppm/C) | Column 4 CTE Y Direction (ppm/C) | Column 5 Max Equivalent Plastic Strain (PEEQ) in BGA Interconnects |
|---|---|---|---|---|
| 1. Conventional core - FR4 with orthotropic CTE | 21 GPa | 14 | 60 | 6.08e−3 |
| 2. Soft-core with low CTE | <5 GPa | 14 | 14 | 3.76e−3 |
| 3. Soft-core with high CTE (CTE approaching that of an ABF Polymer) | <5 GPa | 45 | 45 | 3.70e−3 |
| 4. Medium-core with low CTE | 5-15 GPa | 14 | 14 | 4.77e−3 |
| 5. Medium-core with high CTE (CTE approaching that of an ABF Polymer) | 5-15 GPa | 45 | 45 | 6.61e−3 |
| 6. Soft-core with FR-4 like orthotropic CTE | <5 GPa | 14 | 60 | 3.70e−3 |

The above data was collected Using Finite Element Analysis. Six cases are shown (Column 1). The parameters Core Stiffness (Column 2), CTE in the X direction (Column 3), and CTE in the Y direction (Column 4) were varied to determine their impact on BGA reliability. BGA reliability was measured as a function of Maximum Equivalent Plastic Strain in BGA Interconnects (Column 5). Maximum Equivalent Plastic Strain (PEEQ), as known to one of ordinary skill, is a single output variable that reflects the total accumulation of plastic normal (transverse), axial (longitudinal), and shear strains imparted on a structure, here a critical BGA interconnect positioned along the package substrate perimeter (a location where BGA interconnect fatigue/failures can be of the most concern).

CTE in the X direction represents the expansive and contractive components of CTE relative to direction 310 in FIG. 3, and CTE in the Y direction represents the expansive and contractive components of CTE relative to direction 312 in FIG. 3. For the purpose of this specification, a low CTE is generally considered to be less than approximately 25 ppm/degree Celsius, a medium CTE is considered to be in a range of approximately 25-50 ppm/degree degree Celsius, and a high CTE is considered to be greater than approximately 50 ppm/degree Celsius. For comparison purposes, a CTE of 14 is representative of a conventional fiber reinforced resin core and a CTE of 60 is representative of a core that includes only a pure BT resin material (i.e. no fibers).

As indicted in Table 1, Row 1, the conventional core (FR-4) has a core stiffness that measures approximately 21 Giga Pascals and an orthotropic CTE (i.e. the material expands/contracts in the X direction differently than it does in the Y direction). Under these conditions, the conventional core produces a PEEQ that measures 6.03e−3; a value that can potentially result in BGA strain-related failures.

On the other hand, as indicated by the results of Row 6, in the case where an orthotropic CTE, soft-core material was used, the PEEQ measured approximately 3.70e−3. This translates to a PEEQ reduction of approximately 40% as compared to PEEQ produced by case 1's conventional core. Worth noting is that the predominant contribution to the decrease in PEEQ resulted from a decrease in the plastic equivalent strain in the Y direction or PE22 (as known to one of ordinary skill, plastic strain (PE) can have three components in a 2-dimensional analysis. PE11 represents the plastic strain in the X direction (longitudinal strain), PE22 represents the plastic strain in the y-direction (transverse strain), and PE12 represents the shear strain in the x-y plane).

As indicated by the results in Row's 2, 3, and 6, soft-core materials produced PEEQS that appear to be independent of their CTE. In rows 2 and 3, the soft-core materials had isotropic CTEs (i.e. materials where the CTE in the X direction and the Y direction were approximately the same) that were either relatively low (14 ppm/degrees Celsius) or medium (45 ppm/degrees Celsius) and each produced a PEEQ that was reduced by approximately 40% relative to the conventional core material PEEQ. More specifically, the isotropic CTE soft-core materials of rows 2 and 3 produced PEEQ values of approximately 3.76e–3 and 3.70e–3, respectively.

However, as indicated by the results in Rows 4 and 5, the isotropic CTE, medium-core materials produce disparate results depending on their relative CTE. In Row 4, where the core material had a relatively low isotropic CTE that measured approximately 14 ppm/degree Celsius, the PEEQ measured approximately 4.77e–3. This translates to an overall PEEQ reduction of approximately 21% as compared to the conventional core material's PEEQ (Row 1). But in Row 5, when the core material's CTE was increased to approximately 45, the resulting PEEQ increased to a value 6.61e–3. This value actually exceeds the PEEQ produced by the conventional core material by approximately 9%. As indicated by these results, reducing core material's stiffness without taking into consideration its CTE may not necessarily improve reliability of the BGA solder interconnects. This is because CTE and stiffness work together to establish the driving force behind the bending of the package. "Thermal force," an artificial quantity that can be used to understand this driving force, is the product of the material's CTE and its stiffness. As the thermal force increases, so too does package bending (assuming constant IC properties) and PEEQ. So, in cases of medium-stiff/low CTE cores and soft/high CTE cores, the overall thermal forces (and PEEQS) may be comparable. However, with medium-stiff and high CTE cores, the thermal force can be significantly higher because of the increased contribution from both increased stiffness and increased CTE.

The relative similarities between the PEEQ values in Cases 2 and 3, despite their differences in CTE, are believed to be due to differences in the y-direction expansion/contraction component. That is, because the thermal force only considers components of the driving force that contribute to package bending (softness and CTE in the x-direction), it is believed that the y-direction expansion/contraction component can additionally play a role in lowing a core's PEEQ.

The results of Table 1 generally indicate that softer and/or more flexible core materials can reduce the maximum equivalent plastic strain imparted by the IC into critical BGA interconnects. Moreover, softer and/or more flexible core materials that have medium CTEs, such as Case 3, can produce less equivalent plastic strain as compared to a soft-core material with a lower CTE (Case 2). Case 3 is believed to be representative of polymer-type core materials that are used for forming insulating build-up layers, such as layers 204 and 304 in FIGS. 2 and 3, respectively. Examples of such build-up layer materials include, for example Ajinomoto® Build-up Films (ABF). However, as indicated by the results of Case 5, medium-stiff core materials, produce an increase in total accumulated strain as compared to medium-stiff core materials having a low CTE. This suggests that there is an interaction between CTE and modulus of elasticity, and that a point can be reached where there is no benefit to further increasing CTE to reduce total accumulated strain. Materials that can be considered for use as softer and/or more flexible core materials include (1) standard resin materials such as polymides (e.g., KAPTON polyimide, APICAL polyimide, or UPILEX polyimide), Cyanate ester, PTFE (TEFLON polytetrafluoroethylene), BT (bis-maleimide triazine), or LCP (liquid crystal polymer), Dupont PMDA, etc.; (2) microelectronic build-up dielectric materials such as Ajinomoto's ABF-GX, Hitachi's AS11-G, Sumitomo BAKELITE APL-4901 synthetic resin and plastic, Arch Chemicals DURIMIDE polyimide resin, etc.; (3) encapsulants and underfill materials, such as Sumitomo CRP-4152, Loctite Dexter CNB 868, Namics 8434-25, Cycloaliphatic Epoxy (union carbide), etc; and (4) any number of photoresist materials.

To the extent that a softer core material is to be used with an existing package design (e.g., existing build-up layer technology) then from an integration standpoint, in these embodiments using softer materials with a CTE similar to the conventional core to fabricate the core (e.g., Case 6) may be preferable. Alternatively, to the extent that a low CTE is desired or required, then a soft-core material having a relatively low CTE may be preferable (e.g., Case 2). To the extent that a high CTE is desired, then a soft core material having a relatively high CTE may be preferable (e.g., Case 3). To the extent that CTE is not a concern then a soft core material having either a relatively high CTE or a relatively low CTE can be used as material for the core. In embodiments where a medium-stiffness core material is used, then it may be preferable to use core materials having relatively lower CTEs, as higher CTE materials can produce interactions that can negatively impact the BGA plastic strain.

The results of Table 1 are indicative of cases where the density of copper conductive paths in build-up layer region 302A is the same as that of build-up layer region 302B (i.e., the copper densities in build-up layers on either side of the core is balanced). In cases where the density of copper is unbalanced (i.e. the copper density due to more/less conductive traces in region 302A is different than in 302B), less stiff cores may be more prone to package substrate warpage. To the extent that an unbalanced situation exists, then a core material can be selected to provide a stiffness that can reduce the effects of warpage due to the unbalanced condition and still accommodate/absorb the volumetric strains that accompany the expansion/contraction of the IC and package substrate. In accordance with one embodiment, core material stiffness, and ultimately the core material can be selected based upon the amount of warpage that can be tolerated by the IC package. In accordance with an alternative embodiment, the density difference can be tailored to accommodate a particular core material's stiffness. This is explained further with respect to FIG. 4.

Figure 4:
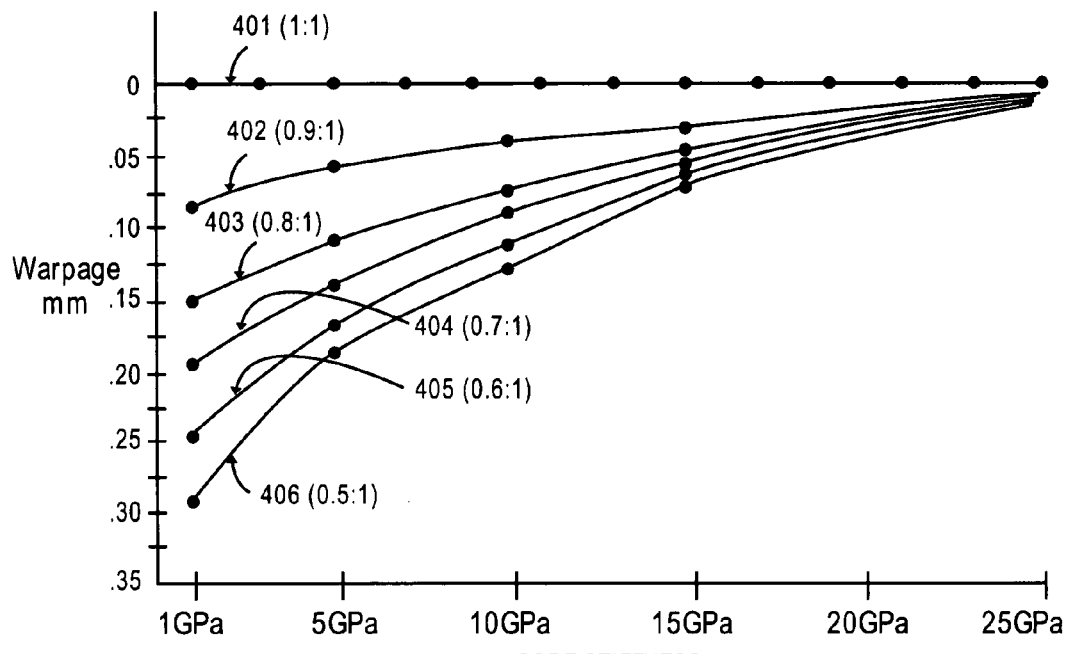
FIG. 4 illustrates an x-y chart showing warpage as a function of core stiffness for various package substrate having unbalanced opposing conductive trace densities.

FIG. 4 is a graph that plots substrate warpage on the y-axis as a function of core stiffness on the x-axis for opposing build-up regions that have copper densities ranging from 1:1 (i.e., the copper density on side 302A is equal to the copper density on side 302B) to 0.5:1 (i.e., the copper density on side 302A is 5/10, or 50% that of the copper density on side 302B, or vice-versa). As the plots of FIG. 4 indicate, to the extent it is determined that package warpage should not exceed a predetermined value (indicated on the y-axis), then opposing build-up layers can be fabricated such that the density difference between the two regions does not exceed a corresponding specific amount. Alternatively, a core's stiffness can be selected for a particular unbalanced condition that will constrain warpage to within a specified tolerance.

For example, to the extent that a soft-core material of approximately 1 GPa (x-axis) is used to fabricate a packaging substrate and it is determined that the packaging substrate's warpage should not exceed 0.20 millimeters (mm) (y-axis), then, as indicated by the line 404 of FIG. 4, opposing build-up layer regions can be fabricated such that the density difference between the two regions does not exceed 0.7:1 (i.e. the copper density difference between the two regions does not exceed 30%) and still meet this warpage requirement. Alternatively, to the extent that package substrate warpage must be constrained to less than 0.20 mm for package substrate having a build-up density difference of approximately 50%, then a core material having stiffness of at least 5 GPa should be selected. This is indicated by the line 406 of FIG. 4. One of ordinary skill appreciates that while the chart of FIG. 4 represents actual data, it is also illustrative of how other such data can be used to influence the relative density of opposing build up layer and the selection and integration of core materials.

Figure 5:
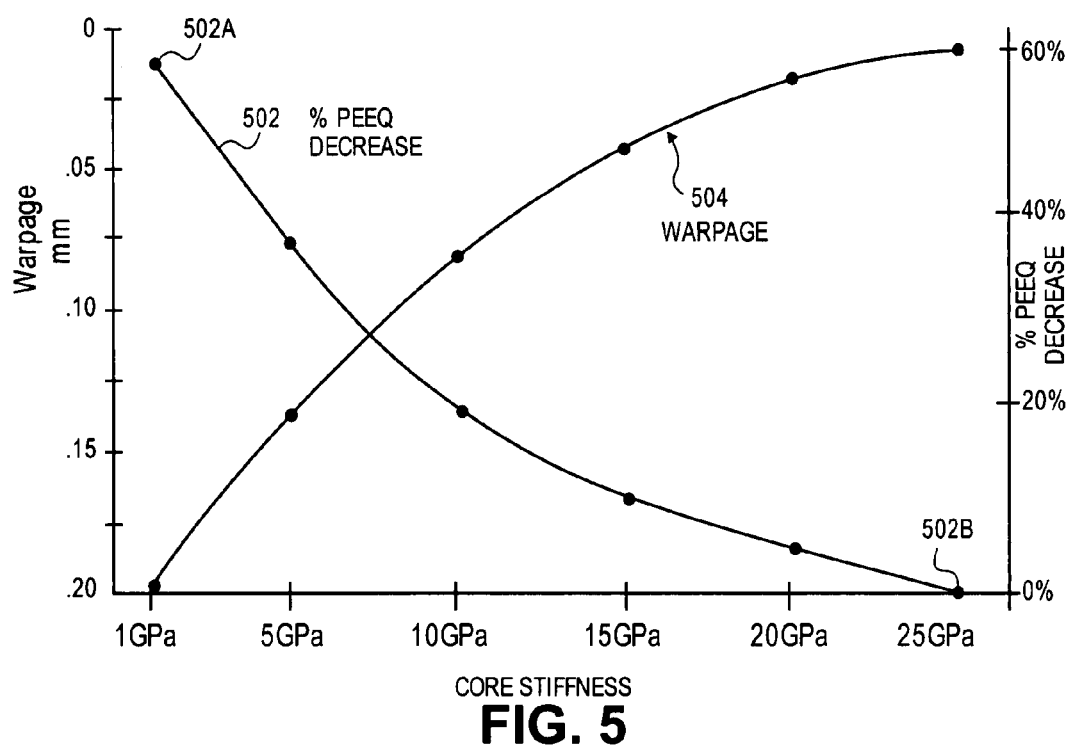
FIG. 5 illustrates an x-y chart showing warpage and percent reduction in maximum equivalent plastic strain as a function of core stiffness for a package substrate having a particular unbalanced conductive trace density.

FIG. 5 further shows an embodiment of how the core stiffness can also be selected based on warpage and/or PEEQ considerations. FIG. 5 is an X-Y chart that plots (1) the percent decrease in maximum plastic equivalent strain as compared to the conventional core (right y-axis) and (2) warpage in millimeters (left y-axis) as functions of core stiffness in GPa (x-axis) for line 404 in FIG. 4 (i.e. the 30% unbalanced case—the case where the copper density on side 302A was 70% that of the copper density on side 302B). As indicated in FIG. 5, as core stiffness increases, (1) package substrate warpage 504 decreases, and (2) the percent decrease in PEEQ 502 decreases (i.e. the maximum equivalent plastic strain increases to values that are closer to that of packages that use conventional core materials).

So, for 30% unbalanced substrates that use core materials having a stiffness of approximately 1 GPa, total accumulated strain is reduced by approximately 60% as compared to the PEEQ produced by the conventional core (point 502A). And, as the core stiffness increases toward 25 GPa (point 502B), the percent decrease in strain decreases toward zero (i.e. PEEQ increases back toward values obtained with conventional core materials). Under these conditions (i.e., a 30% unbalanced substrate), depending on the core stiffness, the amount of warpage and/or the amount of change in PEEQ can be estimated. So for example, if it is determined that warpage should be limited to approximately equal to or less than 0.15 mm and that total accumulated strain should be reduced by at least 20% as compared to the conventional case, then a material having a core stiffness of less than approximately 10 GPa can successfully be used to form the packaging substrate core (under these conditions, according to FIG. 5, warpage will be reduced to less than 10%). Alternatively, if it is determined that the only core material that can be successfully integrated into the package has a core stiffness of, for example, approximately 8 GPa, then opposing build-up layer unbalancing can be accommodated up to 30% and still produce approximately a 25% decrease in PEEQ and a warpage of only approximately 0.11 mm. 4. One of ordinary skill appreciates that while the chart of FIG. 5 represents actual data, it is also illustrative of how other such data can be used to influence decisions with respect to the selection and integration of core materials.

One of ordinary skill appreciates that most cores include copper-lined plated thru-holes (PTHs) that can span the thickness of the core material. To the extent that the PTHs significantly contribute to the stiffness of the core, then alternative PTH materials, such as conductive polymers can be used to reduce the PTH contribution to stiffness.

One or more embodiments of the present invention replace fiber reinforced resin stiff core materials (used in conventional packaging substrates) with softer, and/or more flexible core materials. These can include, for example non-fiber reinforced resin materials. While one embodiment of the present invention considers PEEQ in determining how soft a core material and/or what the CTE of the core material can/should be, alternative embodiments balance considerations such as PEEQ, opposing build-up layer balancing, and/or substrate warpage when integrating the core material into the substrate.

One or more embodiments of the present invention facilitate an increase in BGA solder joint reliability by reducing the amount of damage to BGA solder joints incurred as a result of coefficient of thermal expansion mismatch between an integrated circuit and a packaging substrate. Reducing the amount of damage to BGA solder joints facilitates further shrinking of the BGA solder ball size, which cannot currently be done with conventional core materials without impacting BGA reliability because the smaller BGA interconnects have smaller interfaces through which cracks must propagate. Decreasing the BGA solder ball size allows more input/output (I/O) and power connections to be made between the IC and external circuitry, as well as reduces package costs by reducing the amount of materials required. In addition, reducing the strain transferred to the BGA interconnects eases BGA solder ball design rule restrictions, which correspondingly relaxes depopulation and critical-to-function BGA solder ball requirements. Furthermore, increased BGA solder joint reliability will allow for higher lifetimes under harsh thermal, shock, and flexure conditions, which will increase the overall reliability of the packaged semiconductor substrate.

The various implementations described above have been presented by way of example and not by way of limitation. Thus, for example, while embodiments disclosed herein reference flip-chip mounted semiconductor devices in BGA substrates. One of ordinary skill appreciates that semiconductor devices which have been mounted to a substrate using other techniques or using other package types (e.g., pin grid array (PGA) packages, land grid array (LGA) packages, or any package-type that uses an IC directly or indirectly mounted to a core material) can advantageously use soft/medium core materials to improve package reliability.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A semiconductor package substrate comprising:
   a core region; and
   a first build-up layer region and a second build-up layer region, wherein the core region is disposed between the first build-up layer region and a second build-up layer region, and wherein the core region comprises a material having a modulus of elasticity less than approximately 15 Giga Pascals and wherein the material has an isotropic coefficient of thermal expansion that is less than 25 ppm/degree Celcius.

2. The semiconductor package substrate of claim 1 wherein the core region comprises a material having a modulus of elasticity less than approximately 5 Giga Pascals.

3. The semiconductor package substrate of claim 1 wherein the material is further characterized as a polymer-type core material.

4. An apparatus that includes a semiconductor package substrate, the semiconductor package substrate comprising a core region disposed between first and second build-up layer regions, wherein the core region includes a material having a modulus of elasticity less than approximately 15 Giga Pascals and wherein the material has an isotropic coefficient of thermal expansion that is less than 25 ppm/degree Celcius.

5. The apparatus of claim 4 wherein the core region comprises a material having a modulus of elasticity less than approximately 5 Giga Pascals.

6. The semiconductor package substrate of claim 4 wherein the material is further characterized as a polymer-type core material.

* * * * *